United States Patent [19]

Yamamoto et al.

[11] Patent Number: 5,268,571
[45] Date of Patent: Dec. 7, 1993

[54] MICRO-DISPLACEMENT ELEMENT, AND SCANNING TUNNELING MICROSCOPE AND INFORMATION PROCESSING APPARATUS USING SAME

[75] Inventors: Keisuke Yamamoto, Yamato; Yutaka Hirai, Tokyo; Masaru Nakayama, Atsugi; Takayuki Yagi, Machida; Yuji Kasanuki, Isehara; Yoshio Suzuki, Atsugi, all of Japan

[73] Assignee: Canon Kabushiki Kaisha, Tokyo, Japan

[21] Appl. No.: 888,789

[22] Filed: May 27, 1992

[30] Foreign Application Priority Data

May 28, 1991 [JP] Japan ................. 3-150942

[51] Int. Cl.⁵ .................................... H01J 37/26
[52] U.S. Cl. ........................... 250/306; 250/307
[58] Field of Search ..................... 250/306, 307

[56] References Cited

U.S. PATENT DOCUMENTS

| | | | |
|---|---|---|---|
| 4,668,865 | 5/1987 | Gimzewski et al. | 250/306 |
| 4,806,755 | 2/1989 | Duerig et al. | 250/306 |
| 5,043,577 | 8/1991 | Pohl et al. | 250/307 |
| 5,075,548 | 12/1991 | Kajimura | 250/306 |
| 5,107,114 | 4/1992 | Nishioka et al. | 250/306 |
| 5,136,162 | 8/1992 | Miyamoto | 250/306 |

FOREIGN PATENT DOCUMENTS

| | | |
|---|---|---|
| 0262253 | 4/1988 | European Pat. Off. |
| 0262637 | 4/1988 | European Pat. Off. |
| 0272935 | 6/1988 | European Pat. Off. |
| 0387906 | 9/1990 | European Pat. Off. |
| 0472342 | 2/1992 | European Pat. Off. |
| 63-161552 | 7/1988 | Japan |
| 8907256 | 8/1989 | PCT Int'l Appl. |
| 9015986 | 12/1990 | PCT Int'l Appl. |

OTHER PUBLICATIONS

Albrecht, et al., Journal of Vacuum Science And Technology: Part A, Microfabrication of Integrated Scanning Tunnelling Microscope, vol. 8 No. 1 (Jan. 1980), pp. 317-318.
Patent Abstracts of Japan, vol. 6, No. 25 (E-94) (903) (Feb. 13, 1982) & JP-A-56 144 585.
J. Vac. Sci. Technol. A8(1), Jan./Feb. 1990, p. 317-318, Thomas R. Albrecht et al., "Microfabrication of Integrated Scanning Tunneling Microscope."
G. Binning et al., "Scanning tunneling microscopy," Helvetica Physica Acta, vol. 55, No. 6, 1982, pp. 726-735.

Primary Examiner—Paul M. Dzierzynski
Assistant Examiner—Kiet T. Nguyen
Attorney, Agent, or Firm—Fitzpatrick, Cella, Harper & Scinto

[57] ABSTRACT

A micro-displacement element comprises a unimorph cantilever having a piezoelectric thin film, a pair of electrodes between which the piezoelectric thin film is sandwiched, and an elastic thin film. One end of the cantilever is supported by a support, and the other end thereof is provided with a probe. The micro-displacement element can be used particularly as an array of plural elements, for an information processing apparatus in which the element faces to a recording medium such that an information recording pulse voltage or an information reproducing bias voltage can be applied to between the probe and the recording medium.

16 Claims, 6 Drawing Sheets

MICRO-DISPLACEMENT ELEMENT, AND SCANNING TUNNELING MICROSCOPE AND INFORMATION PROCESSING APPARATUS USING SAME

BACKGROUND OF THE INVENTION

1. Field of the Invention

The present invention relates to a micro-displacement element comprising a unimorph cantilever, as well as a scanning tunneling microscope (STM) and a large-capacity and high-density information processor using the micro-displacement element.

2. Related Background Art

In recent years, there has been a practice tendency that while the data recording capacity in an information processor is being increased year by year, the size of a recording unit is miniaturized and thus the recording density is heightened. For example, in a digital audio disk in which an optical recording system is utilized, the size of a recording unit is as small as 1 $\mu m^2$. In the background there is the active development of memory materials, and consequently, inexpensive and high-density recording media using organic thin films of organic dyes, photopolymers and the like have come out.

On the other hand, the STM has recently been developed by which the electronic structure of surface atoms of a conductor can be directly observed [G. Binning et al., Helvetica Physica Acta, 55, 726 (1982)], and as a result, the real space image can be measured with a high resolution irrespective of a single crystal or an amorphous substance. In addition, observation can be advantageously made at a low electric power without damaging a medium with current. Moreover, the STM can be operated even in the atmosphere and can be applied to various materials, and for these reasons, it is expected to be employed in many fields.

The STM utilizes the phenomenon that when a voltage is applied to between a metallic probe (a probe electrode) and a conductive material and the probe is then brought close to a position about 1 nanometer distant from the conductive material, a tunnel current flows therebetween. This current is very sensitive to a distance change between them, and therefore the surface information of the real space can be obtained by scanning a probe so as to constantly maintain the current or the average distance between them. In this case, the resolution in the surface direction is about 1 Å.

If the principle of this STM is utilized, a high-density recording, and reproduction can be sufficiently achieved in an atomic order (several angstroms). This as recording reproduction methods, there have been suggested, for example, a method which comprises changing the surface state of a suitable recording layer by the use of a particle beam (an electron beam or ion beam), or an energy beam including a high-energy electromagnetic wave such as X-ray and a visible or ultraviolet light, for recording information, and then reproducing it by the STM; and a method in which a material exhibiting a property of switching voltage-current characteristic with a memory effect, for example, a thin film of a $\mu$ electron type organic compound or a chalcogen compound is used as the recording layer, and recording and reproduction are carried out by using the STM (Japanese Patent Appln. Laid-Open No. 63-161552 and the like).

In the information processor utilizing the STM, it is important to control the distance between a probe and a recording medium in an angstrom order. In addition, it has been suggested to simultaneously drive many probes (multiplication of the probe) from the viewpoint of the function improvement of a recording/reproduction system, particularly a high-speed processing.

For this control, a lamination type piezoelectric element, a cylindrical piezoelectric element and the like attached on the probe or the medium have been heretofore used (U.S. Pat. No. 4668865). However, these elements are not suitable for integration, though the use of them permits obtaining a large displacement. Thus, it is inconvenient to use these elements in the multi-probe type information processor. In view of this, a method has been contrived in which a probe is attached on a cantilever having a length of about several hundreds $\mu m$, and this cantilever is then driven by a piezoelectric element.

Figure 9:
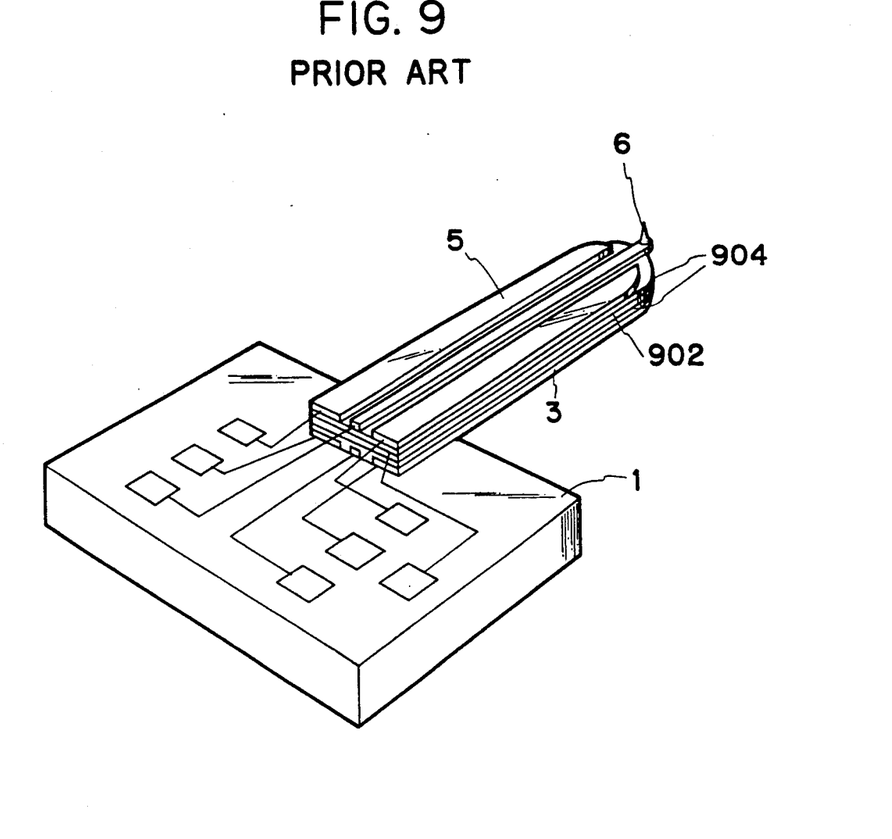
FIG. 9 is a perspective view of a conventional micro-displacement element.
Figure 10:
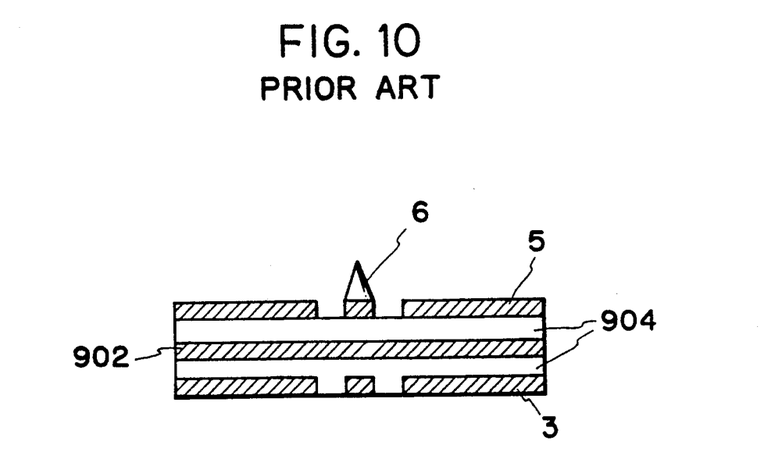
FIG. 10 is a sectional view of the conventional micro-displacement element.

FIGS. 9 and 10 show an example in which a cantilever comprising a piezoelectric bimorph is formed on an Si substrate [Thomas R. Albrecht et al., J. Vac. Sci. Technol., A8, p. 317, 1990]. FIG. 9 is its perspective view, and as shown in this drawing, a cantilever is formed on an Si substrate 1 by laminating two-divided lower electrodes 3, a ZnO piezoelectric thin film 904, a medial electrode 902, a ZnO piezoelectric thin film 904 and two-divided upper electrodes, and a portion of the Si substrate under the cantilever is then removed by anisotropic etching so that the cantilever is held to be overhung from the edge of the Si substrate.

The cantilever comprising this piezoelectric bimorph is provided on the tip thereof with a metallic probe 6, which detects a tunnel current through an outgoing electrode. In this case, when voltages are independently applied to the four regions including two piezoelectric regions sandwiched between the upper electrodes 5 and the medial electrode 902 of the cantilever as well as two piezoelectric regions sandwiched between the lower electrodes 3 and the medial electrode 902 as shown in the sectional view of FIG. 10, the cantilever having the probe 6 can be independently moved.

However, when the cantilever having such a piezoelectric bimorph structure as seen in the conventional example is subjected to high-speed scanning, inconvenient mechanical vibration called host vibration is liable to occur on the cantilever, which makes a correct image observation difficult.

Additionally, in the case where a plurality of cantilevers are integrally arranged, there is a problem that some of them bend owing to the internal stress of the piezoelectric thin films or the electrode thin films. This is considered to be attributable to the non-uniformity of the piezoelectric thin films and the electrode thin films at the time of the formation of these films by a sputtering process or a vapor deposition process.

For the writing or reading of information in the information processor, it is necessary that all of the respective cantilevers operate normally. When the precision of these cantilevers is poor, an external compensating operation and the like are required to securing the precision.

In addition, since the cantilever takes the piezoelectric bimorph structure using the two piezoelectric layers, many manufacturing steps are necessary, which leads to the complication of the cantilever formation. As a result, it is difficult to control the stress of the thin films in the respective layers.

SUMMARY OF THE INVENTION

An object of the present invention is to provide a novel micro-displacement element by which host vibration generated on a cantilever at the time of high-speed scanning can be remarkably decreased and by which image observation, recording and reproduction can be achieved with high precision and reproducibility, and to provide an STM and an information processor using the micro-displacement element.

Another object of the present invention is to provide a multi-type micro-displacement element array by which the bend and unevenness of plural cantilevers arranged on one substrate can be reduced to the utmost and by which image observation, recording and reproduction can be achieved with high precision and reproducibility, and to provide an STM and an information processor using the multi-type micro-displacement element array.

The above-mentioned objects can be accomplished by the following present invention.

That is, the first aspect of the present invention is connected to a micro-displacement element which comprises a unimorph cantilever having a piezoelectric thin film, a pair of electrodes between which the piezoelectric thin film is sandwiched and an elastic thin film, one end of the cantilever being supported by a support, the other end thereof being provided with a probe for the input and output of information.

The second aspect of the present invention is connected to a multi-type micro-displacement element array in which at least two of the above-mentioned micro-displacement elements are arranged in a two-dimensional state.

The third aspect of the present invention is connected to a scanning tunneling microscope which comprises the above micro-displacement element disposed so as to face, an electrical conductor, a driving means for driving the micro-displacement element, a control means for controlling the driving means, a means for applying a voltage to between the electrical conductor and the probe, a means for detecting a tunnel current which flows between the electrical conductor and the probe, and a means for outputting an information as to the surface of the electrical conductor on the basis of the detection of a tunnel current.

The fourth aspect of the present invention is connected to an information processing apparatus which comprises the above micro-displacement element disposed so as to face to a recording medium, a driving means for driving the micro-displacement element, a control means for controlling the driving means, and a means for applying an information recording pulse voltage to between the recording medium and the probe.

The fifth aspect of the present invention is connected to an information processing apparatus which comprises a micro-displacement element disposed so as to face to a recording medium, a driving means for driving the micro-displacement element, a control means for controlling the driving means, and a means for applying an information reproducing bias voltage between the recording medium and the probe.

The sixth aspect of the present invention is connected to an information processing apparatus which comprises a micro-displacement element disposed so as to face to a recording medium, a driving means for driving the micro-displacement element, a control means for controlling the driving means, a means for applying an information recording pulse voltage to between the recording medium and the probe, and a means for applying an information reproducing bias voltage between the recording medium and the probe.

BRIEF DESCRIPTION OF THE DRAWINGS

FIGS. 3A and 3B show the responsiveness of the micro-displacement element of the present invention, and FIG. 3A shows an applied voltage and FIG. 3B shows a displacement.

FIGS. 4A and 4B show the responsiveness in the case that a bimorph cantilever is used.

DETAILED DESCRIPTION OF THE PREFERRED EMBODIMENTS

In the present invention, a cantilever-like displacement element for giving a micro-displacement is not formed so as to have a bimorph structure in which two piezoelectric thin films are each sandwiched between electrodes but so as to have a unimorph structure which comprises an elastic thin film and a single piezoelectric thin film sandwiched between a pair of electrodes, whereby host vibration at a high-speed operation can be decreased, the number of steps at the time of manufacture can be reduced, and multiple film formation steps which are liable to accelerate uniformity in forming the thin films are inhibited to be small as possible.

Furthermore, when a material having a linear thermal expansion coefficient which is comparable to that of the piezoelectric thin film is selected as a material for the elastic thin film, the element which is thermally stable and scarcely bends can be obtained.

The reason for selecting such a material is that it is necessary to perform the control in a molecular/atomic order, i.e., in an order of several nm, and when there is a temperature difference, the cantilever tends to bend inconveniently by a bimetal effect.

The preferable combination of the elastic thin film and the piezoelectric thin film is such that the linear thermal expansion coefficients of both materials are equal to each other, and at least the following relation formula may be met:

$$(A-B)/A \times 100 \leq 50\%$$

wherein A is the linear thermal expansion coefficient of the material constituting the elastic thin film, and B is the linear thermal expansion coefficient of the material constituting the piezoelectric thin film. The typical examples of the combinations are as follows: Elastic thin film: $MgO(A: 1.3 \times 10^{-5}/k)$ and piezoelectric thin film: ZnO(B:1.5×10$^{-5}$/k); elastic thin film: Mo-(A:5.0×10$^6$/k) piezoelectric thin film: AlN (B:5.0×10$^{-6}$/k); and elastic thin film: Si (A:2.5×10$^{-6}$/k) and piezoelectric thin film: PbTiO$_3$(Bb 3.0×10$^{-6}$/k). The thickness of the elastic thin film is to be about the same as that of the piezoelectric thin film, and it is preferably in the range of 0.1 to 1.5 μm. The material of the elastic thin film may be organic or inorganic. Moreover, in the micro-displacement element of the present invention, it is important that a Young's modulus of the elastic thin film as a damper (a brake material) is set in a suitable range. That is, in the high-speed operation in STM, for example, the displacement will overshoot, when a pulse voltage is applied as a control voltage. This phenomenon is considered to be attributable to the characteristic frequency.

It is necessary that the Young's modulus of the elastic thin film is set in the range of $1 \times 10^4$ to $5 \times 10^{11} N/m^2$, preferably in the range of $1 \times 10^6$ to $5 \times 10^8 N/m^2$.

In the above-mentioned information processor, a sine wave, a triangular wave, a rectangular wave or the like which is an alternating signal in a wide band is used as a driving signal of the micro-displacement element. Therefore, the disposition of the elastic thin film permits removing unnecessary vibration.

Furthermore, a different deformation of a probe can be independently made by additionally providing a pair of electrodes on the cantilever in its crosswise direction, which is a feature of the present invention.

In the case of the multi-type micro-displacement element array, the respective cantilevers are precisely formed, and as a result, high-quantity cantilevers are manufactured in a high yield without forming warped reject articles.

Figure 1:
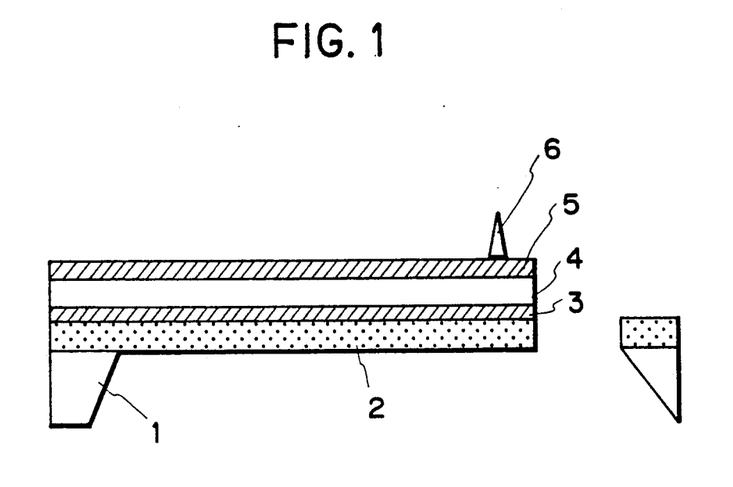
FIG. 1 is a sectional view of a micro-displacement element of the present invention.
Figure 2:
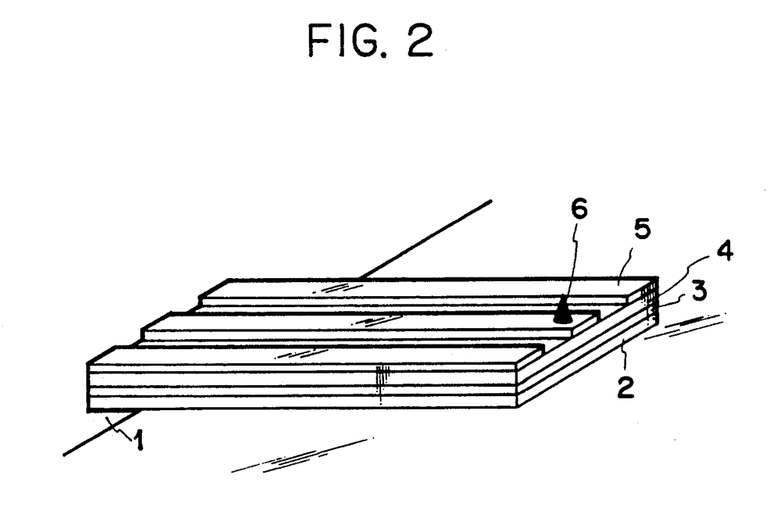
FIG. 2 is a perspective view of the micro-displacement element of the present invention.

FIG. 1 shows a sectional view of the micro-displacement element of the present invention, and FIG. 2 shows its perspective view.

An elastic thin film 2 is formed on an Si substrate 1, and on this elastic thin film 2, there are laminated a lower electrode 3, a piezoelectric thin film 4, an upper electrode 5 and a probe 6 in this order. A plurality of such micro-displacement elements are disposed on the same Si substrate, and an electric field is applied to the piezoelectric portions to drive the cantilevers, whereby reading and writing are carried out by the use of a tunnel current.

Now, the present invention will be described in detail in reference to examples.

Example 1

Figure 5:
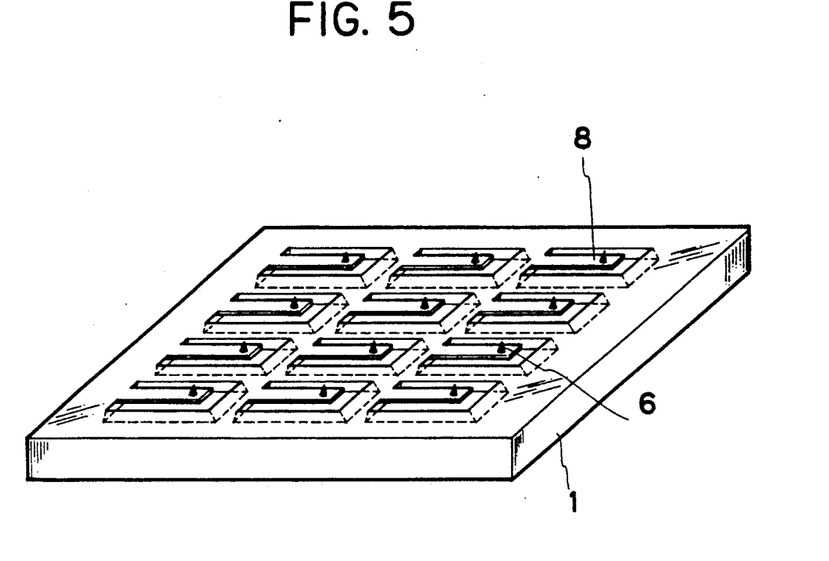
FIG. 5 is a perspective view of a multi-type micro-displacement element array of the present invention.

FIG. 5 shows a schematic view of plural micro-displacement elements.

Twelve (4×3=12) cantilevers 8 each comprising an elastic thin film and a piezoelectric thin film having a pair of electrodes formed in the undermentioned steps are provided on an Si (100) substrate 1 having a size of 6 mm×6 mm and a thickness of 0.3 mm, and a probe 6 for writing or reading of signals is provided on each cantilever. With regard to the size of each cantilever, its width is 100 μm and its length is 500 μm.

The preparation method of each of the abovementioned cantilevers will be described in reference to FIG. 1. In the first place, an Si$_3$N$_4$ film having a thickness of about 1500 Å was formed as an elastic thin film 2 on an Si (100) substrate 1 (thickness 0.3 mm) by a CVD method. In this case, the Young's modulus of this Si$_3$N$_4$ film was $2 \times 10^{11}$ N/m$^2$. The used gas was SiH$_2$Cl$_2$:NH$_3$ =1:9, and the film formation temperature was 800° C.

Next, the elastic thin film 2 was patterned in a desired shape by photolithography and CF$_4$ dry etching. Afterward, a Cr film of 50 Å and an Au film of 1000 Å were formed thereon to prepare a lower electrode 3, and patterning was then carried out by photolithography and wet etching. Next, a ZnO film of 3000 Å was formed as a piezoelectric thin film 4 by a sputtering method. This sputtering was carried out in an O$_2$ atmosphere by using sintered ZnO as a target. Furthermore, patterning was made by photolithography and wet etching. Afterward, two-divided upper electrodes 5 were formed in the same manner as in the case of the lower electrode 3. Next, a W film was formed as an electrode material for a probe, and a probe 6 was then formed by photolithography and lift-off. Afterward, desired portions of the Si substrate 1 were removed therefrom by Si anisotropic etching with KOH to prepare a micro-displacement element.

The warpage of the thus prepared micro-displacement element was determined on the basis of the height gap between the tip of the free end of the cantilever and the Si substrate. The measured height gaps of the 12 cantilevers were in the range of about ±1 μm.

Furthermore, the above-mentioned warpage did not change even in the temperature range of 0° C. to 60° C.

Figure 3A:
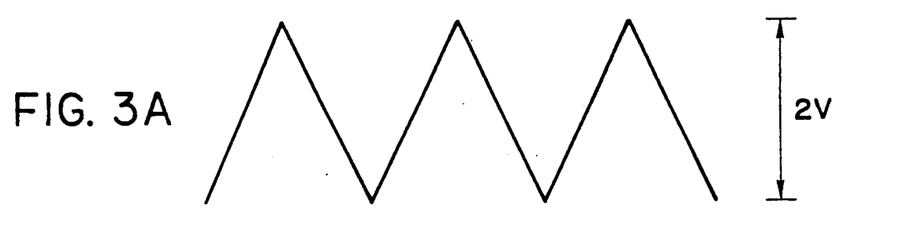
Figure 3B:
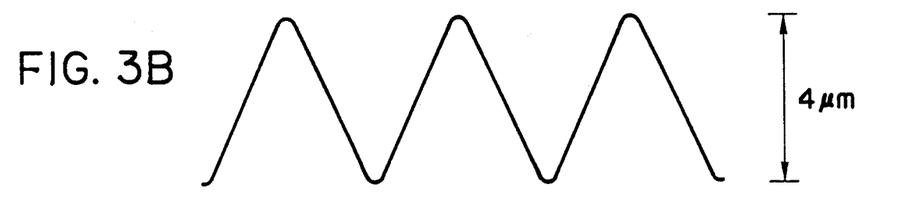

Next, an alternating current having such a triangular wave as shown in FIG. 3A was applied to one of the cantilevers of the micro-displacement element array. In this case, frequency was 500 Hz. At this time, the response of the cantilever was as shown in FIG. 3B, and it was confirmed that the cantilever was excellent in responsiveness. As is apparent from the drawing, host vibration scarcely occurred.

In addition, when electric fields having different waveforms were separately applied to the two-divided upper electrodes 5, drive could be given as much as about 100 Å in the crosswise direction.

Comparative Example

The same procedure as in Example 1 was effected except that the number of steps was increased, to form a micro-displacement element having a bimorph structure in which two piezoelectric thin films having a medial electrode therebetween were contained. At this time, with regard to warpage, height gaps between the tips of the free ends of 12 cantilevers and the Si substrate were ±150 μm.

Figure 4A:
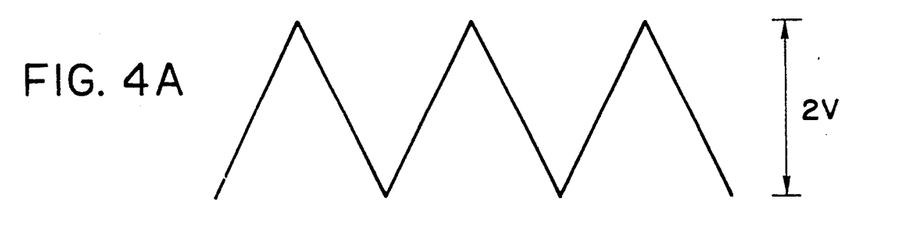
FIG. 4A shows an applied voltage and FIG. 4B shows a displacement.
Figure 4B:
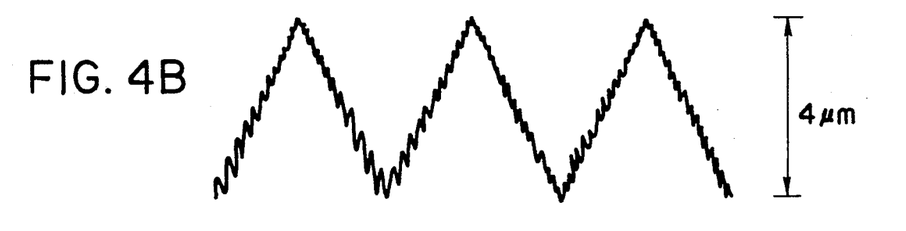

Furthermore, such a triangular wave as shown in FIG. 4A was applied to one of the cantilevers having the bimorph structure (frequency 500 Hz). In this case, the response of the cantilever was as shown in FIG. 4B. That is, host vibration occurred, and in an image observation by the use of this cantilever, much noise was present, which made the correct image observation difficult.

Example 2

Figure 6:
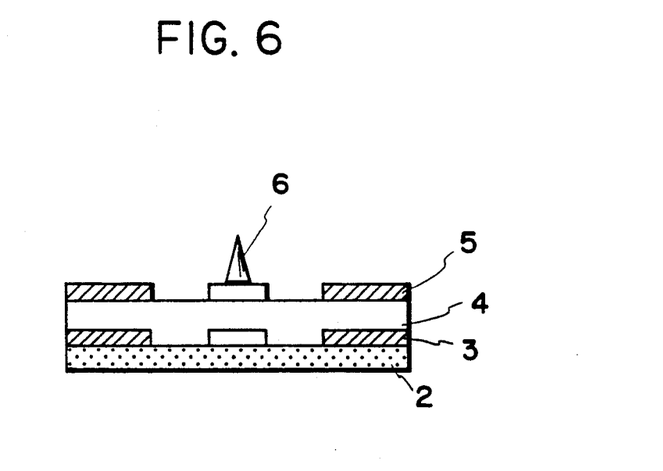
FIG. 6 is a sectional view of the micro-displacement element of Example 2 of the present invention.

Example 2 will be described in regard to FIG. 6. After an elastic thin film of Si$_3$N$_4$ was formed in the same manner as in Example 1, two-divided lower electrodes 3 having a Cr film of 50 Å and an Au film of 1000 Å were then formed. Afterward, a PbTiO$_3$ film of about 5000 Å was formed by a sputtering method. The target used was a PbTiO$_3$ sintered body, and the sputtering was carried out in an O$_2$+Ar atmosphere to form a piezoelectric thin film 4. Afterward, the film was patterned by lithography and etching, and Al was then vapor-deposited thereon to form upper two-divided electrodes 5. Afterward, a Pt film was formed and a probe 6 was then prepared.

A structural point which is different from Example 1 is that both of the upper and lower electrodes are divided into two portions. When electric fields having different waveforms are applied to the two pairs of facing electrodes, not only up-and-down movement but also planar movement can be achieved.

Example 3

The same procedure as in Example 2 was followed except that $Si_3N_4$ was replaced with MgO as an elastic thin film, that $PbTiO_3$ was replaced with ZnO as a piezoelectric thin film and that the thicknesses of thin films were both 1 μm, to form a micro-displacement element array. The rate of change of the warpage of this displacement element was 100 ppm or less in the range of $-20°$ C. to $60°$ C.

Example 4

The same procedure as in Example 2 was followed except that $Si_3N_4$ was replaced with Mo as an elastic thin film, that $PbTiO_3$ was replaced with AlN as a piezoelectric thin film and that the thicknesses of the thin films were both 5000 Å, to form a micro-displacement element array. The rate of change of the warpage of this displacement element was 100 ppm or less in the range of $-20°$ C. to $60°$ C.

Example 5

The same procedure as in Example 2 was followed except that $Si_3N_4$ was replaced with Si as an elastic thin film, that $PbTiO_3$ was used as a piezoelectric thin film and that the thickness of the thin films were both 3000 Å, to form a micro-displacement element array. The rate of change of the warpage of this element was 100 ppm or less in the range of $-20°$ C. to $60°$ C. Example 6

Figure 7:
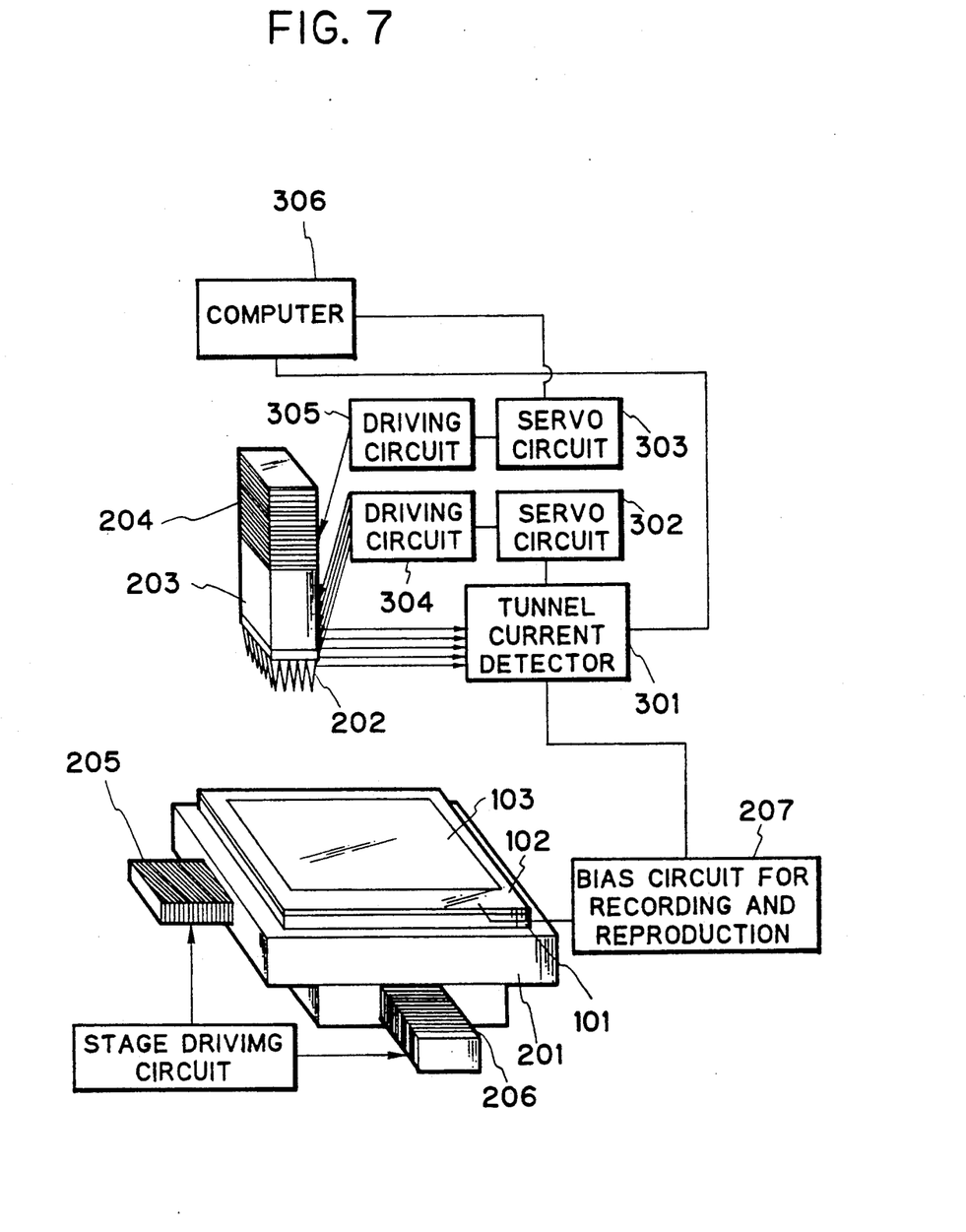
FIG. 7 is a schematic view of the recording/reproducing apparatus used in Example 2.

A micro-displacement element array having thirty $(5 \times 6 = 30)$ micro-displacement elements prepared as in Example 2 was attached to an information processor shown in FIG. 7.

Reference numeral 101 is a substrate for a medium, numeral 102 is a metallic electrode layer, and 103 is a recording layer. Furthermore, numeral 201 is an XY stage, 202 is a probe of the micro-displacement element, 203 is a support for the micro-displacement element array, 204 is a linear actuator for driving the micro-displacement element array in the Z direction, 205 and 206 are linear actuators for driving the XY stage in the X and Y directions, respectively, and 207 is a bias circuit for recording and reproduction. Reference numeral 301 is a tunnel current detector for recording and reproduction which detects a current flowing from the probe electrodes to the electrode layer 102 through the recording layer 103. Numeral 302 is a servo circuit for moving the cantilevers in the Z axis direction, and 303 is a servo circuit for driving the actuator 204. Numeral 304 is a driving circuit for moving the plural cantilevers in the Z axis direction, and 305 is a driving circuit for coarse control of the distance between the probe and the recording layer. Numeral 306 is a computer for controlling the above-mentioned operation.

In this embodiment, the micro-displacement element array was attached to this information processor, and Cr/Au was vapor-deposited on the glass substrate as a recording medium. On this recording medium, four-layer polyimide LB film (about 15 Å) was formed, and the thus obtained product was used. A voltage of 1.5 V was applied to the electrode of the recording medium and the probe of the micro-displacement elements. Electric fields were applied to the piezoelectric thin films of the micro-displacement elements to move the positions of the probes so that a tunnel current of about $10^{-8}$ A might flow through each of the probes of the 30 micro-displacement elements. In this case, the electric fields which were independently applied to the 30 piezoelectric thin films were almost uniform, and their deviations were in the range of $\pm 10\%$ or less.

Furthermore, when a pulse voltage is applied to this recording medium, the resistivity of the recording medium characteristically changes as much as about 2 figures.

Afterward, a pulse voltage (10 V) was applied to the probes, and information was recorded at a desired position. In this case, the region of the position was very small, i.e. about 100 Å × 100 Å, whereby the ultra-high-density recording could be done.

Next, a voltage of 1.5 V was applied to between the probe and the electrode of the recording medium to inspect the change of the tunnel current. As a result, a change of the resistance value was detected at a recorded position. In this example, it was confirmed that the writing and reading of information could be achieved.

Example 7

In this example, reference will be made to the results of an experiment by the use of the above-mentioned recording/reproduction apparatus as STM.

A recording medium which was a material to be observed was scanned by the use of the information processor described in Example 6, and a voltage was applied to between the probe electrodes 202 and the material to be observed to output the results of tunnel current values, whereby an STM image was obtained. In this example, an Si substrate (100) was used as the material to be observed to obtain the STM image. As a result, the image could be observed in an atomic order in a wide range of the Si substrate, and in this case, a stable image scarcely having noise could be obtained.

Example 8

A cantilever was fabricated as in Example 1

At first, on an Si (100) substrate 1 (thickness: 0.3 mm) was formed an acrylic resin film as an elastic thin film 2 to a thickness of about 1 μm according to a coating method. The Young's modulus of this acrylic resin was $2 \times 10^7 N/m^2$. The elastic thin film 2 was then patterned to a desired shape according to photolithography and wet etching. Butyl acetate was used as an etchant. Subsequently, Cr and Au films were formed to thicknesses of 50 Å, and 1000 Å, respectively, followed by patterning according to photolithography and wet etching, whereby a lower electrode 3 was formed. Next, an AlN film was formed to a thickness of 1 μm as a piezoelectric thin film 4 according to a sputtering method. A sintered AlN target was used and the sputtering was conducted in an Ar atmosphere. The film formed was then patterned according to photolithography and wet etching. Subsequently, an upper electrode 5 was formed in the same manner as for the lower electrodes 3.

Next, a Pt film as an electrode material for probe was formed, followed by photolithography and lift-off to form a probe 6. Thereafter, desired portions of the Si substrate 1 were removed through anisotropic etching of Si by KOH to complete the fabrication of micro-displacement elements.

The thus obtained micro-displacement element was subjected to measurement of displacement properties and was found to have a characteristic frequency of 15 KHz. The mechanical Q value at a resonance was about 2.

As an elastic material, a low rigidity material having a Young's modulus of $1 \times 10^6$ to $5 \times 10^8 N/m^2$ may preferably be employed to further reduce the host vibration and improve the responsiveness. This is effective particularly for operating the micro-displacement element of the present invention as an STM.

In the STM operation, the tunnel current is monitored and the STM probe moves following the irregularity of the medium. The micro-displacement element for moving the STM probe should desirably be free from overshooting, host vibration, etc.

For this purpose, an elastic thin film having a small Young's modulus may be used to decrease the mechanical Q value. Thereby obtaining a micro-displacement element free from overshooting.

Figure 8A:
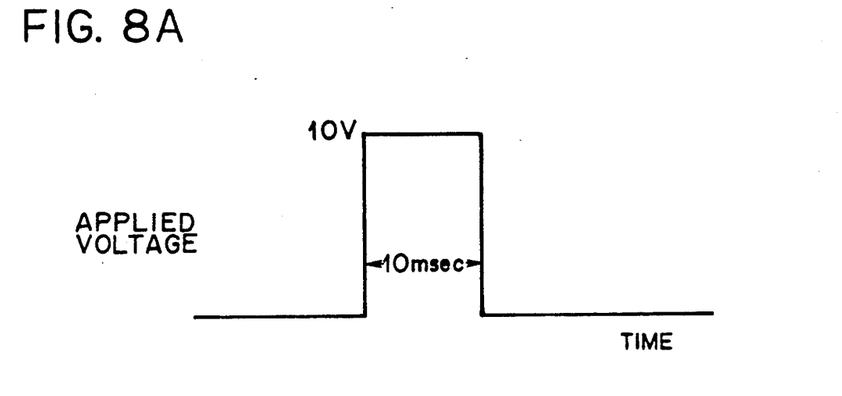
FIGS. 8A to 8C show the characteristics of the micro-displacement element of Example 4.
Figure 8B:
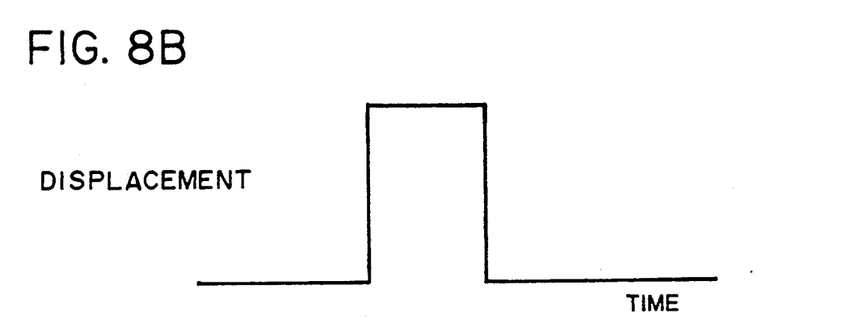
Figure 8C:
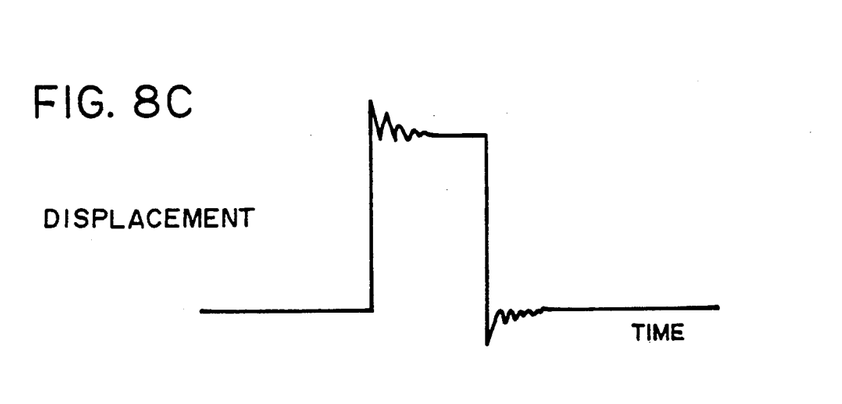

FIGS. 8A to 8C show the characteristics of the micro-displacement device of this example. A rectangular wave voltage of 10 msec and 10 V as shown in FIG. 8A was applied to the micro-displacement element. The displacement (response) in case of using an elastic material having a small Young's modulus exhibits no overshooting as shown in FIG. 8B, while the displacement in case of using an elastic material having a large Young's modulus exhibits some over-shooting at the rising points as shown in FIG. 8C, thus needing a time to determine the position.

As above, by employing a material having a Young's modulus of $1 \times 10^6$ to $5 \times 10^8 N/m^2$ as an elastic material, an STM of high-speed response is realized.

In addition, when an elastic thin film having a small Young's modulus, generation of bending by temperature change can be eliminated even if the thermal expansion coefficient of the piezoelectric material differs greatly from that of the elastic thin film.

As described above, according to the present invention, there can be utilized a micro-displacement element in which a probe for detecting a tunnel current is provided on a cantilever comprising a silicon substrate, and an elastic thin film, a pair of electrodes and one piezoelectric thin film interposed between the pair of electrodes on the silicon substrate, whereby an information processor suitable for a high-speed operation can be obtained which is excellent in temperature characteristic, responsiveness and operability and in which STM is applied. Furthermore, in a micro-displacement element array having plural probes, the respective cantilevers do not warp and maintain a planar state, and therefore yield increases and a control effect also heightens.

In consequence, according to the information processor in which the STM is applied, ultra-high-density recording and reproduction can be achieved, and an inexpensive processor can be supplied.

What is claimed is:

1. A micro-displacement element which comprises a unimorph cantilever having a piezoelectric thin film, a pair of electrodes between which the piezoelectric thin film is sandwiched and an elastic thin film, the Young's modules of the elastic thin film being in the range of $1 \times 10^6$ to $5 \times 10^8 N/m^2$, wherein the linear thermal expansion coefficient (A) of the material constituting the elastic-thin film is comparable to that (B) of the material constituting the piezoelectric thin film, wherein the relation between the linear thermal expansion coefficients of the elastic thin film and the piezoelectric thin film meets the following formula $(A-B)/A \times 100 \leq 50\%$; and wherein one end of the cantilever is supported by a support and the other end thereof is provided with a probe for the input and output of information.

2. The micro-displacement element according to claim 1 wherein the Young's modulus of the elastic thin film is in the range of $1 \times 10^4$ to $1 \times 10^{11} N/m^2$.

3. The micro-displacement element according to claim 1 wherein at least one of the electrodes is divided in its crosswise direction.

4. The micro-displacement element according to claim 1, wherein the material constituting the elastic thin film is an organic material.

5. The micro-displacement element according to claim 1 wherein the material constituting the piezoelectric thin film is selected from the group consisting of zinc oxide, aluminum nitride and zinc titanium oxide.

6. A multi-type micro-displacement element array in which at least two of the micro-displacement elements according to any of claims 1, 2, 3, 4 or 5 are arranged in a two-dimensional state.

7. A scanning tunneling microscope which comprises the micro-displacement element according to any of claims 1, 2, 3, 4, or 5 disposed so as to face to an electrical conductor, a driving means for driving the micro-displacement element, a control means for controlling the driving means, a means for applying a voltage to between the electrical conductor and the probe, a means for detecting a tunnel current which flows between the electrical conductor and the probe, and a means for outputting an information as to the surface of the electrical conductor on the basis of the detection of the tunnel current.

8. An information processing apparatus which comprises the micro-displacement element according to any of claims 1, 2, 3, 4 or 5 disposed so as to face to a recording medium, a driving means for driving the micro-displacement element, a control means for controlling the driving means, and a means for applying an information recording pulse voltage to between the recording medium and the probe.

9. The information processing apparatus according to claim 8 wherein the recording medium has an electrical memory effect.

10. The information processing apparatus according to claim 8 wherein the surface of the recording medium is non-conductive.

11. An information processing apparatus which comprises the micro-displacement element according to any of claims 1, 2, 3, 4 or 5 disposed so as to face to a recording medium, a driving means for driving the micro-displacement element, a control means for controlling the driving means, and a means for applying an information reproducing bias voltage to between the recording medium and the probe.

12. The information processing apparatus according to claim 11 wherein the recording medium has an electrical memory effect.

13. The information processing apparatus according to claim 11 wherein the surface of the recording medium is non-conductive.

14. An information processing apparatus which comprises the micro-displacement element according to any of claims 1, 2, 3, 4 or 5 disposed so as to face to a recording medium, a driving means for driving the micro-displacement element, a control means for controlling the driving means, and a means for applying an information recording pulse voltage to between the recording medium and the probe, and a means for applying an information reproducing bias voltage to between the recording medium and the probe.

15. The information processing apparatus according to claim 14 wherein the recording medium has an electrical memory effect.

16. The information processing apparatus according to claim 14 wherein the surface of the recording medium is non-conductive.

* * * * *

UNITED STATES PATENT AND TRADEMARK OFFICE
CERTIFICATE OF CORRECTION

PATENT NO. : 5,268,571
DATED : December 7, 1993
INVENTOR(S) : KEISUKE YAMAMOTO, ET AL.

It is certified that error appears in the above-identified patent and that said Letters Patent is hereby corrected as shown below:

ON TITLE PAGE

In [30] Foreign Application Priority Data, insert:
--May 20, 1992 [JP] Japan ..... 4-151255--.

IN THE DRAWINGS

Sheet 4 of 6, FIG. 7, "DRIVIMG" should read --DRIVING--.

COLUMN 1

Line 51, "This as" should read --Thus, as--.
Line 62, "µ electron" should read --π electron--.

COLUMN 2

Line 9, "(U.S. Pat. No. 4668865)." should read
--(U.S. Pat. No. 4,668,865).--.
Line 60, "to securing" should read --for securing--.

COLUMN 3

Line 38, "face," should read --face--.
Line 41, "to" should be deleted.

COLUMN 5

Line 9, "inorganic. Moreover," should read
--inorganic. ¶ Moreover,--.

UNITED STATES PATENT AND TRADEMARK OFFICE
CERTIFICATE OF CORRECTION

PATENT NO. : 5,268,571

DATED : December 7, 1993

INVENTOR(S) : KEISUKE YAMAMOTO, ET AL.

It is certified that error appears in the above-identified patent and that said Letters Patent is hereby corrected as shown below:

COLUMN 5

Line 55, "undermentioned" should read --under-mentioned--.
Line 61, "abovemen-" should read --above-men- --.

COLUMN 6

Line 24, "Furthermore," should read --Moreover,--.

COLUMN 7

Line 37, "Example" should be deleted.
Line 38, "6" should read heading --Example 6--.

COLUMN 8

Line 64, "electrodes 3." should read --electrode 3.--.

COLUMN 9

Line 21, "Q value. Thereby" should read --Q value, thereby--.
Line 31, "over-shooting" should read --overshooting--.

UNITED STATES PATENT AND TRADEMARK OFFICE
CERTIFICATE OF CORRECTION

PATENT NO. : 5,268,571
DATED : December 7, 1993
INVENTOR(S) : KEISUKE YAMAMOTO, ET AL.

It is certified that error appears in the above-identified patent and that said Letters Patent is hereby corrected as shown below:

COLUMN 10

Line 13, "$1 \times 10^4$ to $1 \times 10^{11}$ N/m2" should read --$1 \times 10^4$ to $1 \times 10^{11}$ N/m$^2$--.

Signed and Sealed this

Twenty-eighth Day of June, 1994

Attest:

BRUCE LEHMAN

Attesting Officer    Commissioner of Patents and Trademarks